United States Patent
Tsai et al.

(10) Patent No.: US 9,680,091 B2
(45) Date of Patent: Jun. 13, 2017

(54) STRUCTURE AND METHOD FOR A COMPLIMENTARY RESISTIVE SWITCHING RANDOM ACCESS MEMORY FOR HIGH DENSITY APPLICATION

(75) Inventors: Chun-Yang Tsai, New Taipei (TW); Yu-Wei Ting, Taipei (TW); Kuo-Ching Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/598,378

(22) Filed: Aug. 29, 2012

(65) Prior Publication Data

US 2013/0334486 A1 Dec. 19, 2013

Related U.S. Application Data

(60) Provisional application No. 61/660,102, filed on Jun. 15, 2012.

(51) Int. Cl.
*H01L 47/00* (2006.01)
*H01L 45/00* (2006.01)

(52) U.S. Cl.
CPC .............. *H01L 45/12* (2013.01); *H01L 45/08* (2013.01); *H01L 45/1233* (2013.01); *H01L 45/146* (2013.01); *H01L 45/1641* (2013.01); *H01L 45/1675* (2013.01)

(58) Field of Classification Search
CPC ... H01L 45/08; H01L 45/1233; H01L 45/146; H01L 45/1641
USPC ........................................... 257/1–4; 365/148
See application file for complete search history.

(56) References Cited

U.S. PATENT DOCUMENTS

| | | | |
|---|---|---|---|
| 7,057,923 B2 | 6/2006 | Furkay et al. | |
| 7,777,215 B2 | 8/2010 | Chien et al. | |
| 7,778,063 B2 | 8/2010 | Brubaker et al. | |
| 7,835,172 B2 | 11/2010 | Shinozaki | |
| 8,009,454 B2 | 8/2011 | Lee et al. | |
| 8,289,752 B2 | 10/2012 | Lu et al. | |
| 8,575,585 B2 * | 11/2013 | Yang et al. | 257/2 |
| 8,891,284 B2 | 11/2014 | Williams et al. | |
| 2009/0039332 A1 | 2/2009 | Lee et al. | |
| 2010/0034010 A1 | 2/2010 | Xi et al. | |

(Continued)

FOREIGN PATENT DOCUMENTS

| | | |
|---|---|---|
| CN | 1627546 | 6/2005 |
| CN | 101409327 | 4/2009 |

(Continued)

OTHER PUBLICATIONS

Yuchao Yang, "Complementary resistive switching in tantalum oxide-based resistive memory devices", May 16, 2012, Applied Physics Letters, 100.*
Wong, H.-S. Philip, et al., "Metal-Oxide RRAM," 0018-9219/$31.00 © 2012 IEEE, 20 pages.

(Continued)

*Primary Examiner* — John C Ingham
*Assistant Examiner* — Frederick B Hargrove
(74) *Attorney, Agent, or Firm* — Haynes and Boone, LLP

(57) ABSTRACT

The present disclosure provides a resistive random access memory (RRAM) structure. The RRAM structure includes a bottom electrode on a substrate; a resistive material layer on the bottom electrode, the resistive material layer including a defect engineering film; and a top electrode on the resistive material layer.

17 Claims, 9 Drawing Sheets

(56) References Cited

U.S. PATENT DOCUMENTS

| | | |
|---|---|---|
| 2010/0110758 A1 | 5/2010 | Li et al. |
| 2010/0123117 A1 | 5/2010 | Sun et al. |
| 2010/0285633 A1 | 11/2010 | Sun et al. |
| 2010/0327248 A1 | 12/2010 | Khoueir et al. |
| 2011/0095259 A1* | 4/2011 | Lee .................. 257/4 |
| 2011/0220862 A1 | 9/2011 | Arita et al. |
| 2011/0248236 A1* | 10/2011 | Kim .................. G11C 13/0007 257/4 |
| 2011/0291064 A1 | 12/2011 | Marsh et al. |
| 2011/0317470 A1 | 12/2011 | Lu et al. |
| 2012/0040528 A1 | 2/2012 | Kim et al. |
| 2012/0074374 A1 | 3/2012 | Jo |
| 2012/0178210 A1 | 7/2012 | Lee et al. |
| 2013/0001494 A1 | 1/2013 | Chen et al. |
| 2013/0028003 A1* | 1/2013 | Wang et al. .................. 365/148 |
| 2013/0187117 A1* | 7/2013 | Sandhu et al. .................. 257/4 |
| 2013/0207065 A1* | 8/2013 | Chiang .................. 257/2 |
| 2013/0215669 A1 | 8/2013 | Haukness |
| 2013/0234099 A1 | 9/2013 | Sekar et al. |
| 2013/0336041 A1 | 12/2013 | Tsai et al. |
| 2014/0146593 A1 | 5/2014 | Tsai et al. |

FOREIGN PATENT DOCUMENTS

| | | |
|---|---|---|
| CN | 102484127 | 5/2012 |
| WO | WO 2011008195 A2 * | 1/2011 |

OTHER PUBLICATIONS

Wei, Z., et al., "Demonstration of High-density ReRAM Ensuring 10-year Retention at 85° C. Based on a Newly Developed Reliability Model," Advanced Devices Development Center, Panasonic Co., 978-1-4577-0505-2/11/$26.00 © 2011 IEEE, 4 pages.

J. Joshua Yang, Dmitri B. Strukov, and Duncan R. Stewart, "Memristive Devices for Computing," pp. 1-23, Nature Nanotechnology DOI: 10.1038/NNANO. 2012.240, vol. 8, Jan. 2013.

Eikes Cyrus Linn, Rainer Waser, and Tobias Noll; "Complimentary Resistive Switcher" pp. 1-167, Mar. 7, 2012.

Rosezin, R. et al., "Integrated Complementary Resistive Switches for Passive High-Density Nanocrossbar Arrays", pp. 191-193, IEEE Electron Device Letters, vol. 32, No. 2, Feb. 2011.

Ambrogio, S. et al., "Analytical modelling and leakage optimization in complementary resistive switch (CRS) crossbar arrays", pp. 242-245, Solid State Device Research Conference (ESSDERC), 2014 44th European, IEEE, 2014.

* cited by examiner

STRUCTURE AND METHOD FOR A COMPLIMENTARY RESISTIVE SWITCHING RANDOM ACCESS MEMORY FOR HIGH DENSITY APPLICATION

PRIORITY DATA

This application claims priority to U.S. Provisional Patent Application Ser. No. 61/660,102 filed on Jun. 15, 2012, the entire disclosure of which is incorporated herein by reference.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1." There are various architectures to configure an array of RRAM cells. For example, a cross-point architecture include only a RRAM in each cell configured between crossed a word line and a bit line. The cross-point architecture has a high packing density but has a sneak path issue, which causes a fault read during operation. A complementary resistive switches (CRS) structure was recently suggested to solve the sneak path problem of larger passive memory arrays. CRS cells consist of an anti-serial setup of two bipolar resistive switching cells. In the CRS approach, the two storing states are pairs of high and low resistance states so that the overall resistance is always higher, allowing for larger passive cross-point arrays. However, the CRS architecture needs more material layers, therefore more processing steps and more fabrication cost.

Accordingly, it would be desirable to provide an improved RRAM structure and method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
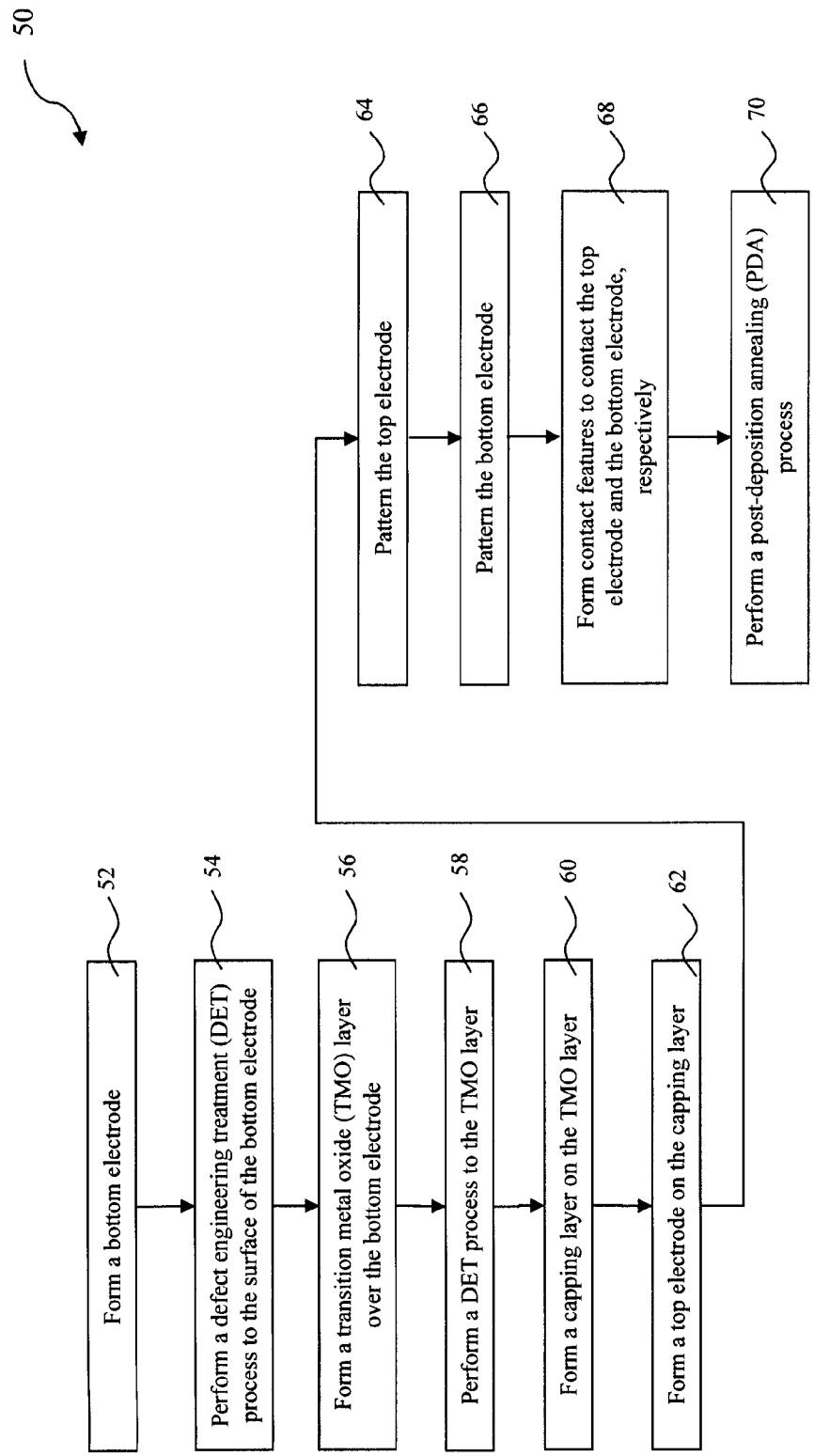
FIG. 1 is a flowchart of a method making of a memory device constructed according to aspects of the present disclosure in various embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 2:
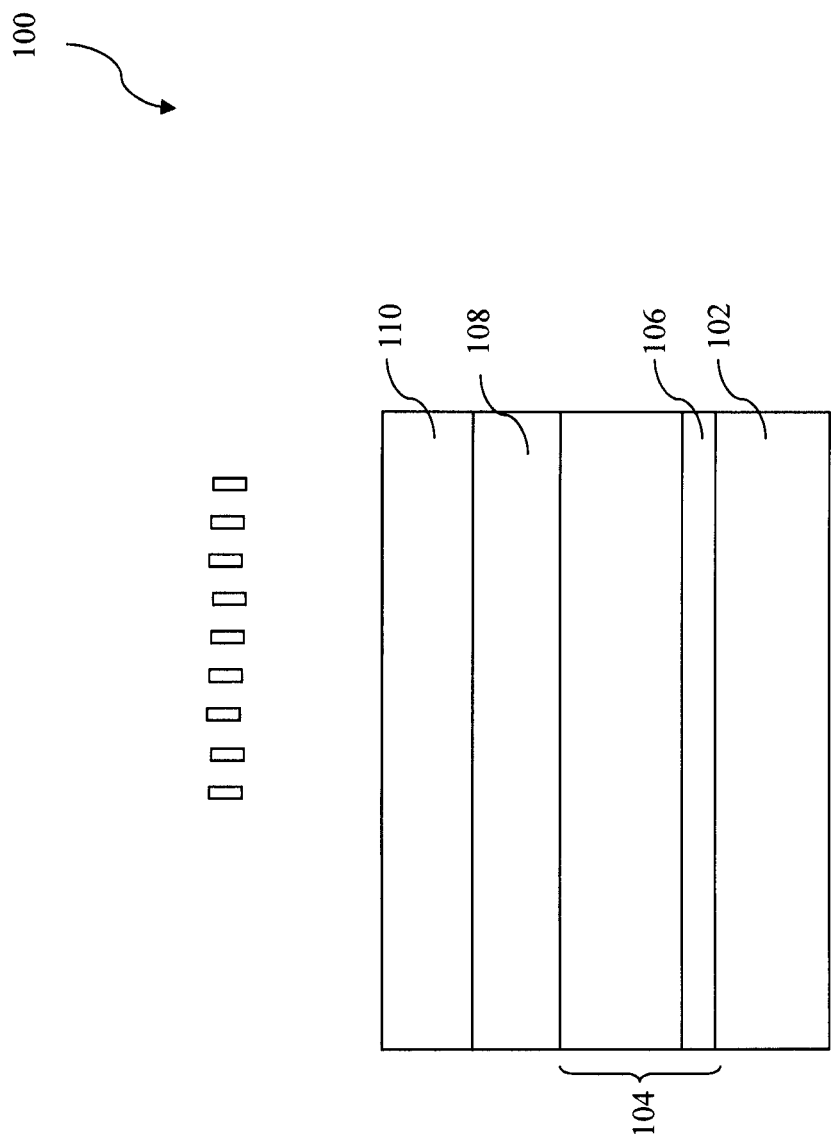
FIGS. 2 and 3 are sectional views illustrating an embodiment of a memory device at various fabrication stages constructed according to aspects of the present disclosure in one embodiment.
Figure 3:
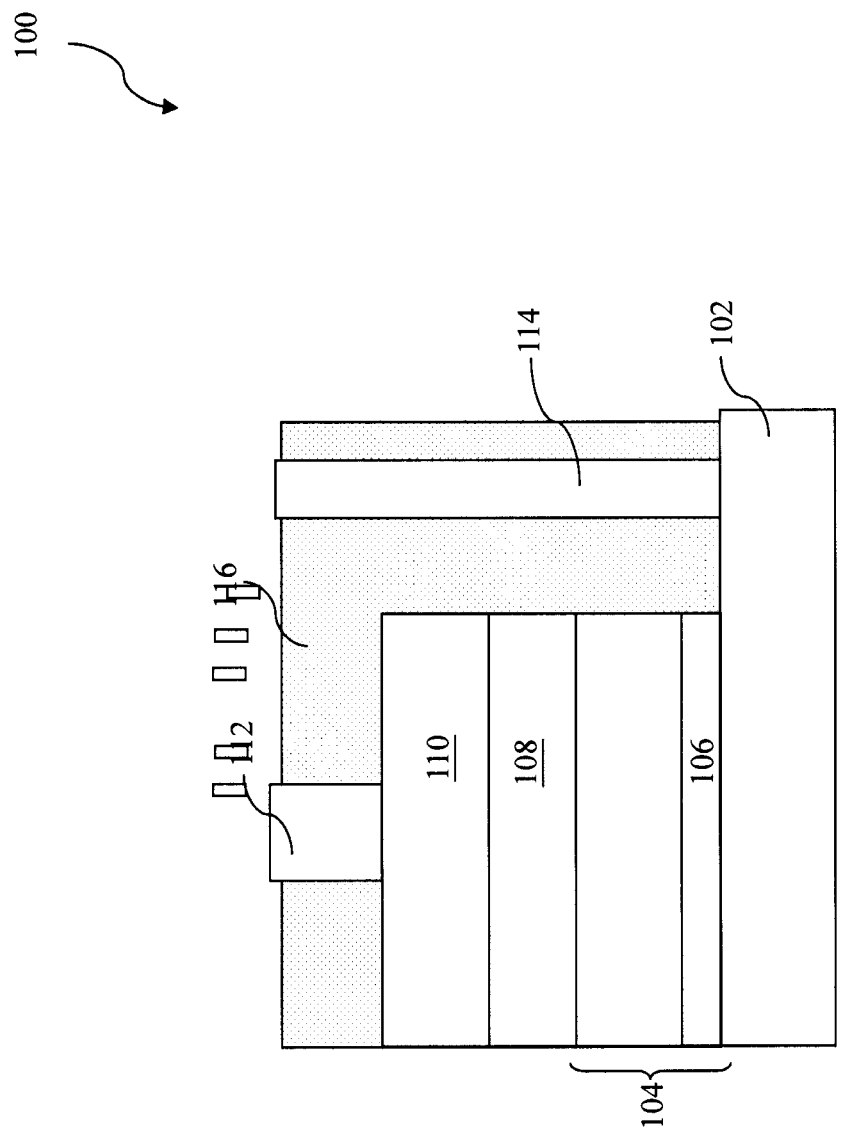
Figure 4:
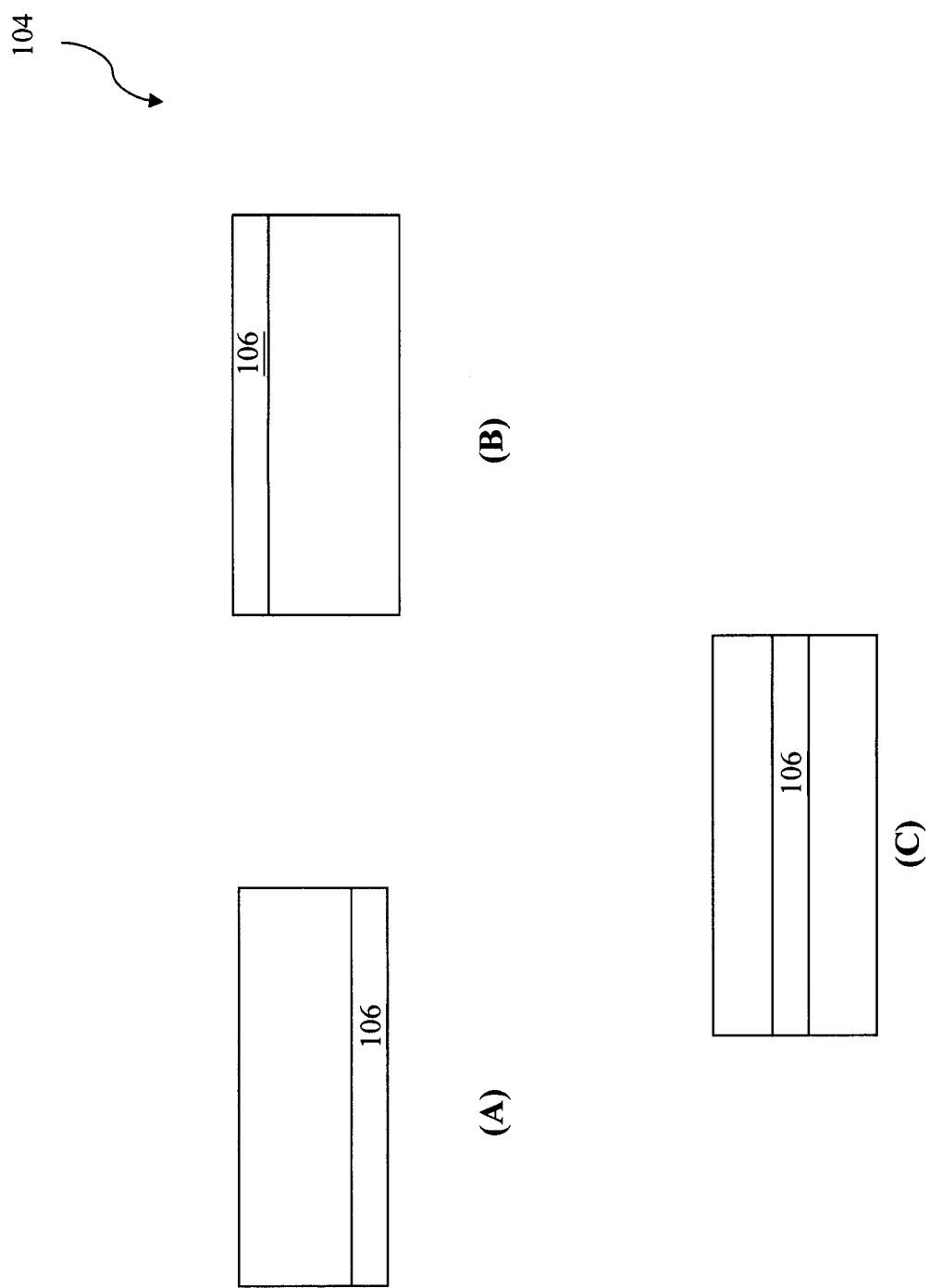
FIG. 4 illustrates sectional views of a dielectric material layer in the memory device of FIGS. 2 and 3 constructed according to aspects of the present disclosure in various embodiments.

FIG. 1 is a flowchart of a method 50 making of a memory device constructed according to aspects of the present disclosure in various embodiments. FIGS. 2 through 3 are sectional views illustrating an embodiment of a memory device 100 at various fabrication stages constructed according to aspects of the present disclosure. FIG. 4 illustrates sectional views of a dielectric material layer in the memory device 100 constructed according to aspects of the present disclosure in various embodiments. With references to FIGS. 1 through 4 and other figures, the memory device 100 and the method 50 making the same are collectively described according to various embodiments.

Referring to FIG. 2, the memory device 100 is a resistive random access memory (RRAM) device, in portion. In one embodiment, the memory device 100 includes a stack of material layers designed and configured to function or behave as a complementary resistive switching (CRS) RRAM. However, the memory device 100 is different from a conventional CRSRAM device that includes an anti-serial setup of two bipolar resistive switching cells. The memory device 100 has a much simple structure with less fabrication cost and therefore is referred to as a single stack complementary resistive switching random access memory (CRSRAM) device as well. Particularly, the memory device 100 has a single resistive state in a first voltage range lower than an intrinsic voltage and dual resistive states in a second voltage range greater than the intrinsic voltage. The CRSRAM device is in a high resistive state in a normal or lower bias. Therefore, the sneak path issue is eliminated. In other embodiment, the memory device 100 is a portion of a memory structure that includes a plurality of memory cells and other integrated circuit devices.

The memory device 100 is formed on a semiconductor substrate, such as a silicon substrate, or alternatively other suitable substrate.

Referring to FIGS. 1 and 2, the method 50 includes a step 52 to form a first electrode (or bottom electrode) 102 of a conductive material. In one embodiment, the first electrode 102 includes titanium nitride (TiN). In another embodiment, the first electrode 102 includes tantalum nitride (TaN) or platinum (Pt). In other embodiments, the first electrode 102 may include other appropriate conductive materials for forming such an electrode, such as metal, metal nitride, doped polycrystalline silicon (doped poly silicon) or combinations thereof.

In one embodiment, the first electrode 102 includes a conductive material having a proper work function such that a high work function wall is built between the first electrode 102 and a resistive material layer subsequently formed. The first electrode 102 can be formed by atomic layer deposition (ALD), physical vapor deposition (PVD or sputtering), or alternatively other suitable processes.

In one embodiment, the first electrode 102 includes TiN and is formed an ALD process using a precursor including TiCl4 and NH3. In furtherance of the present embodiment, The ALD process has a deposition temperature ranging between about 200 C and about 500 C. In yet another embodiment, the first electrode 102 has a thickness ranging between about 100 angstrom and about 2000 angstrom.

Still referring to FIGS. 1 and 2, the method 50 includes a step 54 by performing a defect engineering treatment (DET) process to the first electrode 52. The DET process is designed to generate defects in an interface between the first electrode 102 and a dielectric material layer to be formed at a subsequent fabrication stage. In the present embodiment, the DET process applies a gas to the memory device 100 at a raised temperature. In furtherance of the present embodiment, the DET process includes applying ammonia gas (NH3) to the first electrode 102. The ammonia gas is heated directly or indirectly to a temperature ranging between about 200 C and about 500 C.

In another embodiment, the DET process includes applying a gas, such as NH3, N2, O2, O3, H2O, Cl2, Ar, CF4, H2, N2O, SiH4, CF4, or a combination thereof. During the DET process, the applied gas is directly heated to a high temperature or alternatively, is indirectly heated to the high temperature, such as by heating the memory device 100.

The method 50 includes a step 56 by forming a dielectric material layer (or a resistive material layer) 104 on the first electrode 102. The dielectric material of the dielectric material layer 104 has a characteristic mechanism that its resistivity can be switched between a high resistance state and a low resistance state (or conductive), by applying an electrical voltage. In various embodiments, the dielectric material layer 104 includes metal oxide, metal oxynitride or combinations thereof. In the present embodiment, the dielectric material layer 104 includes a transition metal oxide (TMO). In one example, the dielectric material layer 104 includes zirconium oxide. In other examples, the dielectric material layer 104 includes tantalum oxide or hafnium oxide.

The dielectric material layer 104 may be formed by a suitable technique, such as ALD with a precursor containing zirconium and oxygen. In another example, the dielectric material layer 104 may be formed by PVD, such as a PVD process with a zirconium target and with a gas supply of oxygen to the PVD chamber. The dielectric material layer 104 has a proper thickness for improved memory device performance including retaining time, reliable data storage, and writing easiness. In one example, the dielectric material layer 104 includes a thickness ranging between about 20 angstrom and about 200 angstrom.

The method 50 includes a step 58 by performing a DET process to the dielectric material layer 104. The DET process at the step 58 is similar to the DET process at the step 54. The DET is designed to generate defects on the dielectric material layer 104. In the present embodiment, the DET process applies a gas to the memory device 100 at a raised temperature. In furtherance of the present embodiment, the DET process includes applying ammonia gas (NH3) to the dielectric material layer 104. In one example, the ammonia gas is heated directly or indirectly to a temperature ranging between about 200 C and about 500 C.

In another embodiment, the DET process includes applying a gas, such as NH3, N2, O2, O3, H2O, Cl2, Ar, CF4, H2, N2O, SiH4, CF4, or a combination thereof. During the DET process, the applied gas is directly heated to a high temperature or alternatively, is indirectly heated to a high temperature.

In other alternative embodiments, the method 50 may includes only one of the first DET process at step 54 and the second DET process at step 58. In another embodiment, the DET process may be applied during the deposition of the dielectric material layer. For example, a first portion of the dielectric material layer 104 is deposited, a DET process is applied to the first portion of the dielectric material layer 104, and thereafter a second portion of the dielectric material layer 104 is deposited on the treated first portion of the dielectric material layer 104.

In another embodiment, the formation of the dielectric material layer 104 and the DET process are simultaneously implemented. For example, the dielectric material layer 104 is formed by PVD using a zirconium target and an oxygen-containing gas. The gas supplied to the PVD chamber may further include a gas for DET, such as ammonia. In another example, the gas supplied to the PVD chamber may further include NH3, N2, O2, O3, H2O, Cl2, Ar, CF4, H2, N2O, SiH4, CF4, or a combination thereof. In yet another example, the gas for the DET is heated before introducing to the memory device 100 or during the deposition of the dielectric material layer 104.

The DET process is designed to eventually generate defects in the dielectric material layer 104 so the respective RRAM device is tuned to have a characteristic of current vs. voltage (I-V) similar to a CRSRAM device. Particularly, those defects contribute to introduce more oxygen vacancies. In the present embodiment, a defect engineering film 106 is generated in the dielectric material layer 104. The defect engineering film 106 is capable of depriving oxygen and generating oxygen vacancies in the dielectric material layer 104.

The method 50 may include a step 60 to form a capping layer 108 on the dielectric material layer 104. The capping layer 108 includes a conductive material that is unstable and is capable of depriving oxygen from adjacent material. In the present embodiment, the capping layer 108 includes titanium (Ti) and may be formed by PVD or other suitable technique. In another embodiment, the capping layer 108 has a thickness ranging between about 20 angstrom and about 200 angstrom.

In other embodiments, the capping layer 108 includes Ti, tantalum (Ta) or hafnium (Hf). In another embodiment, the capping layer 108 includes metal oxide. In yet other embodiments, the capping layer 108 and the dielectric material layer 104 are chosen to have a pair of a conductive material and a dielectric material, such as titanium (Ti) and zirconium oxide; or tantalum and tantalum oxide; or hafnium and hafnium oxide. However, the capping layer 108 may be eliminated in other embodiment.

Still referring to FIGS. 1 and 2, the method 50 includes a step 62 by forming a second electrode (or top electrode) 110 on the capping layer 108 or on the dielectric material layer 104 (if the capping layer 108 is not present). In one embodiment, the top electrode 110 includes tantalum nitride (TaN). The top electrode 110 may be formed by PVD or other suitable technique. In another embodiment, the second electrode 110 has a thickness ranging between about 100 angstrom and about 2000 angstrom. Alternatively, the top electrode 110 includes other suitable conductive material to electrically connect the device to other portion of an interconnect structure for electrical routing. In other embodiments, the second electrode 110 includes metal, metal-nitride, doped polysilicon or other suitable conductive material.

Referring to FIGS. 1 and 3, the method 50 includes a step 64 to define the top electrode 110 by patterning. In one embodiment, the top electrode 110 is patterned by a procedure that includes lithography process and etch. For example, a hard mask is deposited on the top electrode 110 and patterned by lithography process and etch; and then the top electrode 110 is etched through the openings of the hard mask. The hard mask is used as an etch mask and may include a suitable dielectric material, such as silicon oxide, silicon nitride, other dielectric material or a combination thereof. In another embodiment, a patterned resist layer is used as an etch mask. In the present embodiment, various material layers of the memory device 100 including top electrode 110, capping layer 108 and dielectric material layer 104 are collectively patterned as illustrated in FIG. 3.

The method 50 also includes a step 66 to define the bottom electrode 102 by patterning. In one embodiment, the bottom electrode 102 is patterned by a procedure similar to the step 64 to pattern the top electrode 110. In one embodiment, the step 66 includes lithography process and etch. For example, an etch mask (hard mask or a patterned resist layer) is formed by lithography process and etch (or lithography process); and then the bottom electrode 102 is etched through the openings of the etch mask. In the present embodiment, the bottom electrode 102 is patterned for proper electrical routing, as illustrated in FIG. 3.

In one embodiment, by steps 64 and 66, a plurality of RRAM cells are formed in an array that is configured such that the respective top and bottom electrodes are properly connected to an interconnection structure. For example, each RRAM cell is configured to be coupled to a word line and a bit line. Particularly, the bottom electrode 102 is patterned to be partially uncovered by the top electrode 110 in a top view.

The steps 64 and 66 may be designed differently to define (or pattern) the top and bottom electrodes. In one embodiment, the steps 64 and 66 are executed in a different sequence. In furtherance of the embodiment, the bottom electrode 102 is patterned and thereafter, the top electrode 110 is patterned. In this case, the material layers that include top electrode 110, capping layer 108, dielectric material layer 104 and bottom electrode 102 are patterned to define the bottom electrode 102. Thereafter, the material layers that include top electrode 110, capping layer 108 and dielectric material layer 104 are further patterned to define the top electrode 110 and partially expose the bottom electrode 102.

The method 50 may further include a step 68 by forming contact features 112 and 114 configured to contact the top electrode 110 and the bottom electrode, respectively. The contact features 112 and 114 are configured to land on the top electrode 110 and the bottom electrode 102, respectively. The contact features include one or more conductive material and may be formed by various suitable techniques. In one embodiment, the contact features (112 and 114) are formed by a procedure that includes dielectric deposition, contact hole etch and metal deposition. This procedure is described below.

A dielectric material layer 116, such as silicon oxide or low k dielectric material, is deposited on the memory device 100 by a technique, such as chemical vapor deposition (CVD). The dielectric material layer 116 may be further polished to planarize the top surface of the memory device 100 by a technique, such as chemical mechanical polishing (CMP). The dielectric material layer 116 may be formed by other method such as a procedure that includes spin-on coating and curing.

Various contact holes are formed in the dielectric material layer 116 by a procedure that includes lithography process and etch. For example, a hard mask is formed on the dielectric material layer 116 and the hard mask includes various openings that define regions for contact holes. An etch process is applied to the dielectric material layer 116 using the hard mask as an etch mask. Then a conductive material is formed in the contact holes by a technique, such as PVD, CVD, plating or combinations thereof. The conductive material includes aluminum copper alloy, copper, tungsten, silicide, other metals, or a combination thereof. A CMP process may be applied to remove excessive deposited conductive material and planarize the top surface of the memory device 100.

The method 50 may further include a step 70 to perform a post-deposition annealing (PDA) process to the memory device 100. The PDA process is designed to further generate oxygen vacancies in the dielectric material layer 104. In one embodiment, the PDA process has an annealing temperature ranging between about 300 C and about 500 C. In one example, one or more DET process and the PDA process are collectively contribute to form the dielectric material layer 104 having a defect engineering film 106 or a defect engineering surface.

Other steps may be implemented before, during and/or after the method 50. In one example, various active devices, such as field effect transistors, may be formed in the substrate by ion implantation, annealing and other processes. In another example, various interconnect features, including metal lines and via features may be formed on the substrate to provide electrical routing to various devices including one or more RRAM cells, forming a functional integrated circuit.

Referring back to FIG. 4, the defect engineering film 106 and the dielectric material layer 104 are further described in term of the DET process and with further consideration of the capping layer 108 and/or PDA process. The defect engineering film 106 is able to deprive oxygen from and generate oxygen vacancies in the dielectric material layer 104 such that the RRAM structure has a characteristic behavior of a CRSRAM device.

The DET process (either applied to the first electrode 102 at step 54 or applied to the dielectric material layer 104 at step 58) can effectively generate defects and the defect engineering film 106 in the dielectric material layer 104. The defect engineering film 106 may be generated in various portions of the dielectric material layer 104 associated with different embodiments of the defect engineering treatment in the method 50.

FIG. 4 provides sectional views of the dielectric material layer 104 constructed according to different embodiments. In one embodiment as illustrated in FIG. 4(A), the defect engineering layer 106 is formed on the bottom portion of the dielectric material layer 104. Particularly, the defect engineering film 106 is formed in the interface between the dielectric material layer 104 and the first electrode 102. In this embodiment, the step 54 is implemented on the bottom electrode 102. Accordingly, the bottom electrode 102, or a top portion of the bottom electrode, is changed by the respective DET process. After the dielectric material layer 104 is deposited, the bottom portion 106 of the dielectric material layer 104 is reacted with the bottom electrode 102 (or further enhanced by the PDA process) to generate defects on the portion 106 of the dielectric material layer 104. In this example, the portion 106 of the dielectric material layer 104 is converted into the defect engineering film 106.

In another embodiment as illustrated in FIG. 4(B), the defect engineering layer 106 is formed on the top portion of the dielectric material layer 104. Particularly, the defect engineering film 106 is formed in the interface between the dielectric material layer 104 and the second electrode 110 (or the capping layer 108 if present). In this embodiment, the step 58 is implemented on the dielectric material layer 104. Accordingly, a top portion 106 of the dielectric material layer 104 is modified (or further enhanced by the capping layer 108 and/or the PDA process) to generate defects on the top portion 106 of the dielectric material layer 104. In this example, the top portion 106 of the dielectric material layer 104 is converted into the defect engineering film 106.

In yet another embodiment as illustrated in FIG. 4(C), the defect engineering layer 106 is in the dielectric material layer 104. Particularly, the defect engineering film 106 is formed in the dielectric material layer 104 away from both surfaces. In this embodiment, a DET process is implemented during the formation of the dielectric material layer 104. For example, a first portion of the dielectric material layer 104 is deposited. A DET process is applied to the first portion of the dielectric material layer 104. Then a second portion of the dielectric material layer 104 is deposited after the DET process. Accordingly, a portion 106 of the dielectric material layer 104 is modified (or further enhanced by the PDA process) to generate defects on the portion 106 of the dielectric material layer 104. In this example, the portion 106 of the dielectric material layer 104 is converted into the defect engineering film 106 embedded in the dielectric material layer 104.

In other embodiments, the dielectric material layer 104 may include more than one defect engineering films 106 formed on top surface of, bottom surface of or embedded in the dielectric material or various combinations thereof. The defect engineering films 106 serve the same purpose to generate more defects (such as oxygen vacancies) in the dielectric material layer 104. The contribution of the defect (such as oxygen vacancies) may be further enhanced by the capping layer 108 and/or the PDA process at step 70.

The dielectric material layer 104 behaves differently because the structure of the dielectric material layer 104 is changed by the DET process (or the defect engineering film). In one example, the dielectric material layer 104 includes zirconium oxide $ZrO_2$ and $ZrO_x$. The subscript x has a value less than 2. A ratio of $ZrO_x/ZrO_2$ in the dielectric material layer 104 is greater than 1. This is further explained with reference to FIG. 5. In another embodiment, the defect engineering film 106 is different from the bulk portion of the dielectric material layer 106 in composition. For example, the defect engineering film 106 has a first oxygen concentration less than a second oxygen concentration of the dielectric material layer 104.

Figure 5:
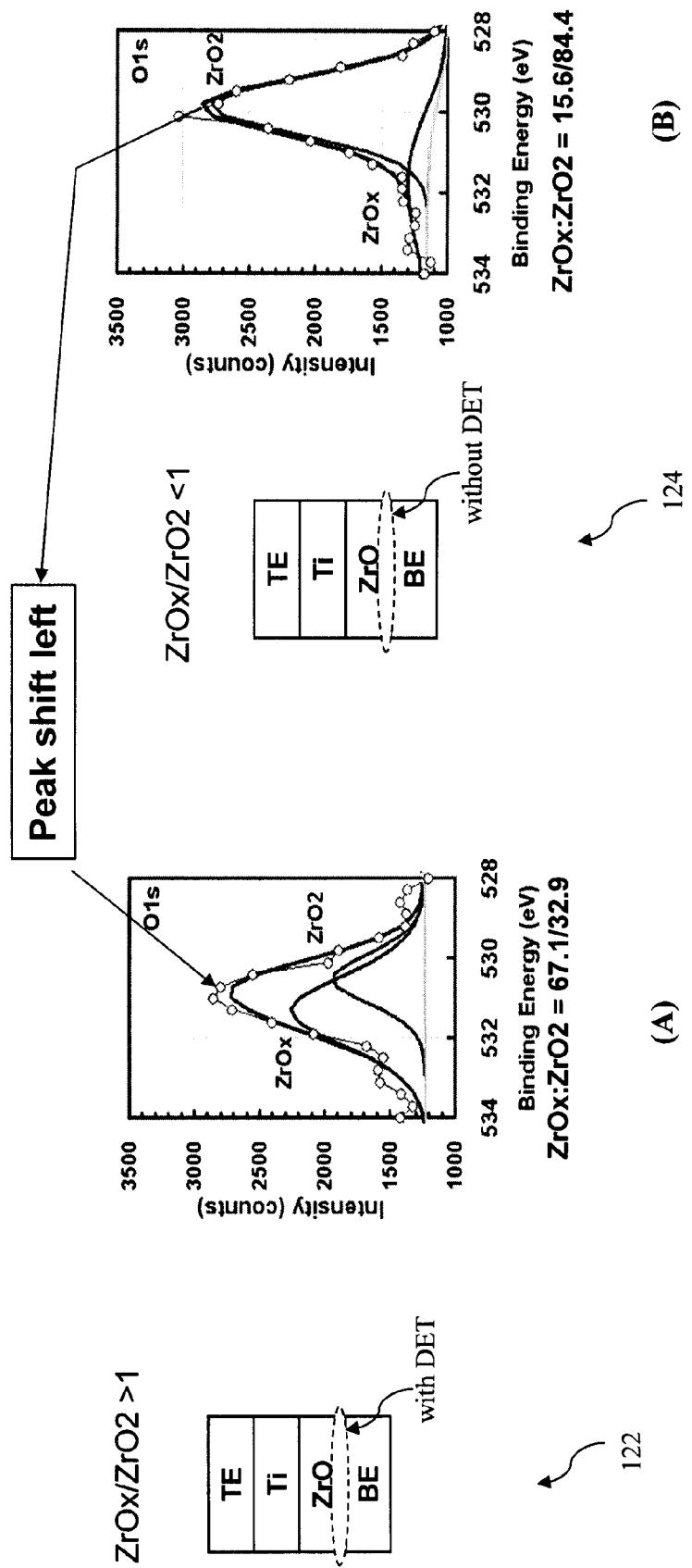
FIG. 5 provides diagrams showing characteristic data of various memory devices in various embodiments.

FIG. 5 provides diagrams showing characteristic data of various memory devices according to various embodiments. The characteristic data are experimental data from X-ray photoelectron spectroscopy (XPS) taken from particular samples. The data of FIG. 4(A) are from a sample 122 of a memory structure fabricated with DET process. The sample 122 is one example of the memory device 100. Particularly, the sample 122 includes a dielectric material layer of zirconium oxide treated by one or more DET process. The analysis indicates that the ratio of $ZrO_x/ZrO_2$ of the dielectric material layer is greater than 1. In this particular example, the ratio of $ZrO_x/ZrO_2$ in the dielectric material layer of the sample 122 is 67.1/32.9.

As a comparison, the data of FIG. 4(B) are from a sample 124 of a memory device fabricated without DET process. The sample 124 is substantially similar to the sample 122 but fabricated without being treated by a DET process. The analysis indicates that the ratio of $ZrO_x/ZrO_2$ of the dielectric material layer is less than 1. In this particular example, the ratio of $ZrO_x/ZrO_2$ in the dielectric material layer of the sample 124 is 15.6/84.4. Furthermore, compared with the sample 124, the O1s spectra of the sample 122 has a left-shift.

Figure 6:
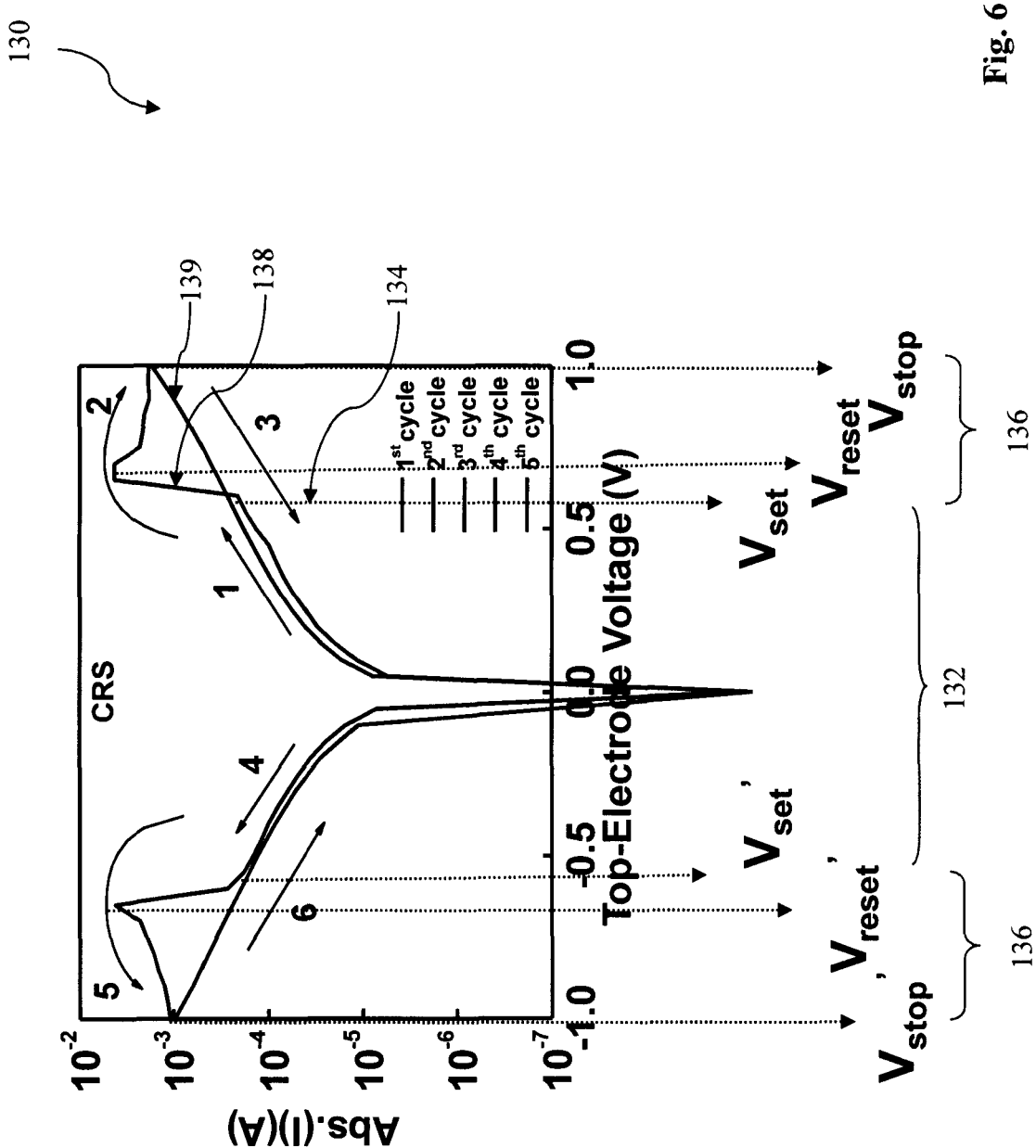
FIG. 6 is a diagram illustrating a current vs. voltage behavior of the memory device of FIGS. 2 and 3 in one embodiment.

FIG. 6 is a diagram illustrating a current vs. voltage curve (I-V curve) 130 of the memory device 100 according to one embodiment. The I-V curve 130 is constructed according to experimental data from one sample of the memory device 100. The horizontal axis represents a bias voltage applied to the memory device 100 (or a voltage applied to the top electrode while the bottom electrode is grounded according to one example). The corresponding unit is volt (or V). The vertical axis represents a current through the memory device 100. The corresponding unit is ampere (or A).

The I-V curve 130 shows hysteric behavior as a RRAM device. Particularly, the I-V curve 130 shows a complementary resistive switching (CRS) behavior of the RRAM device that has a single resistive state in a lower voltage range. Therefore, the unselected cells and half selected cells have bias voltages in the lower voltage range and are in the high resistance state. Accordingly, the sneak path is eliminated.

Specifically, the memory device 100 has a single resistive state in a first voltage range 132 lower than an intrinsic voltage 134 and dual resistive states in a second voltage range 136 greater than the intrinsic voltage 134. The CRSRAM device is in a high resistive state in a normal or lower bias. Therefore, the sneak path issue is eliminated. However, the memory device 100 is different from a conventional CRSRAM that includes an anti-serial coupled two bipolar resistive switching cells. The memory device 100 has a much simple structure and fabricated with less cost as described above. The intrinsic voltage 134 is related to the intrinsic material characteristics of the dielectric material layer 104 in the memory device 100. For example, it is related to the oxygen vacancies in the dielectric material layer 104.

In the second voltage range 136, the I-V curve 130 has dual resistive states: a low resistance (LR) state 138 and a high resistance (HR) state 139. Therefore, the dielectric material layer 104 is able to function as data storage. The LR state 138 and HR state 139 represent "on" (or "1") and "off"

(or "0"), respectively, or vise versa. In the present example, the I-V curve 130 is substantially symmetric for positive voltage and negative voltage. In other words, for given voltages V and −V, the corresponding current I(V) and I(−V) are substantially same. Various points in the I-V curve 130 are labeled as $V_{set}$, $V_{reset}$, $V_{stop}$, $V_{set}'$, $V_{reset}'$, $V_{stop}'$, respectively. The $V_{set}$ equals the intrinsic voltage 134. Those points are further explained later when various operations are discussed.

Figure 7:
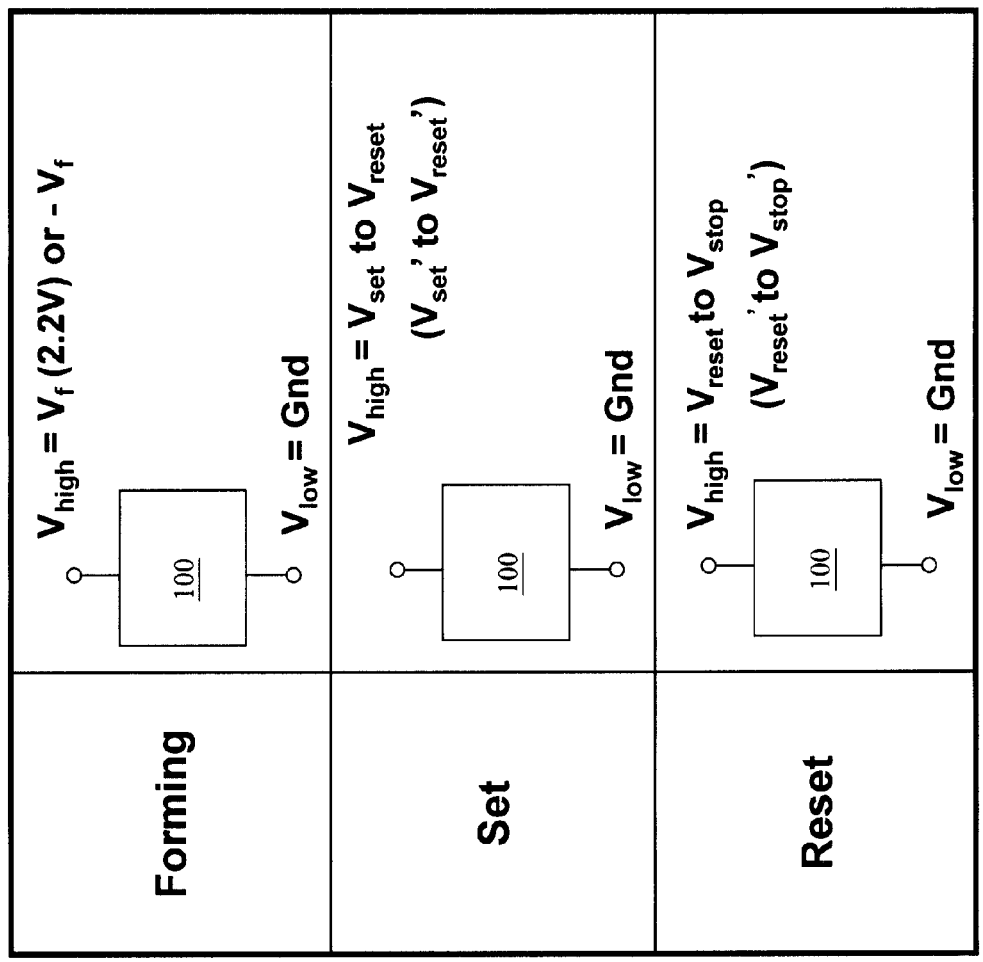
FIG. 7 is a table illustrating various operations of the memory device of FIGS. 2 and 3 constructed according to aspects of the present disclosure in one or more embodiment.

Various operations applied to the memory device 100 during application are provided in FIG. 7 that includes an operation table 140. Those operations are described with reference to FIGS. 6 and 7.

One operation is "forming" that is illustrated in the first row of the operation table 140. In the operation "forming", a forming voltage is applied to the two electrodes of the memory device 100. For example, the bottom electrode 102 is connected to a low voltage $V_{low}$, such as a grounding line ("Gnd") and the top electrode 110 is connected to a high voltage $V_{high}$. The difference of $V_{high}-V_{low}$ provides the "forming" voltage. In the "forming" operation, the "forming" voltage is high enough to generate a conductive portion in the dielectric material layer 104. In one example, the conductive portion includes one or more conductive filament to provide a conductive path such that the dielectric material layer 104 shows "on" or LR state 138. The conductive path may be related to the lineup of the oxygen vacancies in the dielectric material layer 104.

Figure 8:
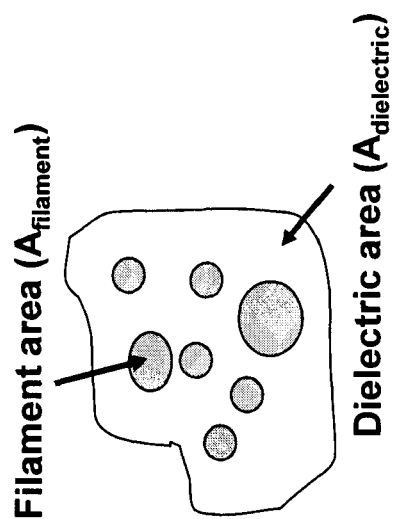
FIG. 8 is a top view of a dielectric material layer in the memory device of FIGS. 2 and 3 constructed according to aspects of the present disclosure in one embodiment.

The formation of the conductive filament by the "forming" operation is illustrated in FIG. 8 as a top view of the dielectric material layer 104 as one example. The dielectric material layer 104 includes a dielectric region with a first area $A_{dielectric}$ and a conductive filament region with a second area $A_{filament}$. In the present embodiment, the ratio of $A_{filament}/A_{dielectric}$ is greater than about 25%.

The operation "forming" needs to be applied only one time. Once the conductive path is formed thereby, it will stay. Other operations may disconnect or reconnect the conductive path with smaller voltages. In the present example only for illustration, the "forming" voltage is about 2.2 V or −2.2 V.

Referring back to FIG. 7, another operation is "set" that is illustrated in the second row of the operation table 140. In the operation "set", a "set" voltage is applied to the two electrodes of the memory device 100, with similar configuration as in the "forming" operation. However, the "set" voltage is much less. For example, the bottom electrode 102 is connected to a low voltage $V_{low}$, such as a grounding line ("Gnd") and the top electrode 110 is connected to a high voltage $V_{high}$. The difference of $V_{high}-V_{low}$ provides the "set" voltage. In the "set" operation, the "set" voltage is high enough to reconnect the conductive path in the dielectric material layer 104 such that the dielectric material layer 104 shows the "on" or LR state 138. The operation "set" turns the dielectric material layer 104 to the LR state 138. For example, if the dielectric material layer 104 is in the HR state, the "set" operation will change it from the HR state to the LR state. If the dielectric material layer 104 is in the LR state, the dielectric material layer 104 will remain in the LR state after the "set" operation. The "set" voltage is in the range from $V_{set}$ to $V_{reset}$, or from $V_{set}'$ to $V_{reset}'$. Both $V_{set}$ and $V_{reset}$ are much less than the "forming" voltage. In the present example only for illustration, $V_{set}$ is about 0.5 V and $V_{reset}$ is about 0.7 V.

Another operation is "reset" that is illustrated in the third row of the operation table 140. In the operation "reset", a "reset" voltage is applied to the two electrodes of the memory device 100, with similar configuration as in the "set" operation. In the "reset" operation, the "reset" voltage is high enough to break the conductive path in the dielectric material layer 104 such that the dielectric material layer 104 shows the HR state 139. The operation "reset" turns the dielectric material layer 104 to the HR state 139. For example, if the dielectric material layer 104 is in the LR state, the "reset" operation will change it from the LR state to the HR state. If the dielectric material layer 104 is in the HR state, the dielectric material layer 104 will remain in the HR state after the "reset" operation. The "reset" voltage is in the range from $V_{reset}$ to $V_{stop}$, or from $V_{reset}'$ to $V_{stop}'$. In the present example, $V_{stop}$ is about 1 V.

Other operations includes read to read out the data stored in the RRAM device. As described above, the memory device 100 has characteristics of a CRSRAM device, and the dual resistance states are present in the second range 136 where the voltage is greater than the intrinsic voltage 134. Therefore, the corresponding "read" voltage needs to be greater than the intrinsic voltage 134 or in the second range 136 to read out the stored data. However, the "set" voltage and "reset" voltage are in the same second range 136. So the "read" operation may change the state of the memory device 100 and destroy the data stored in the memory device 100. Accordingly, an operation "write-back" may be implemented after each "read" operation to recover the previous state. In the present example, the "write-back" voltage has a different polarity to the operations "set" and "reset". If the operations "set" and "reset" are positive, the operation "write-back" is negative.

Figure 9:
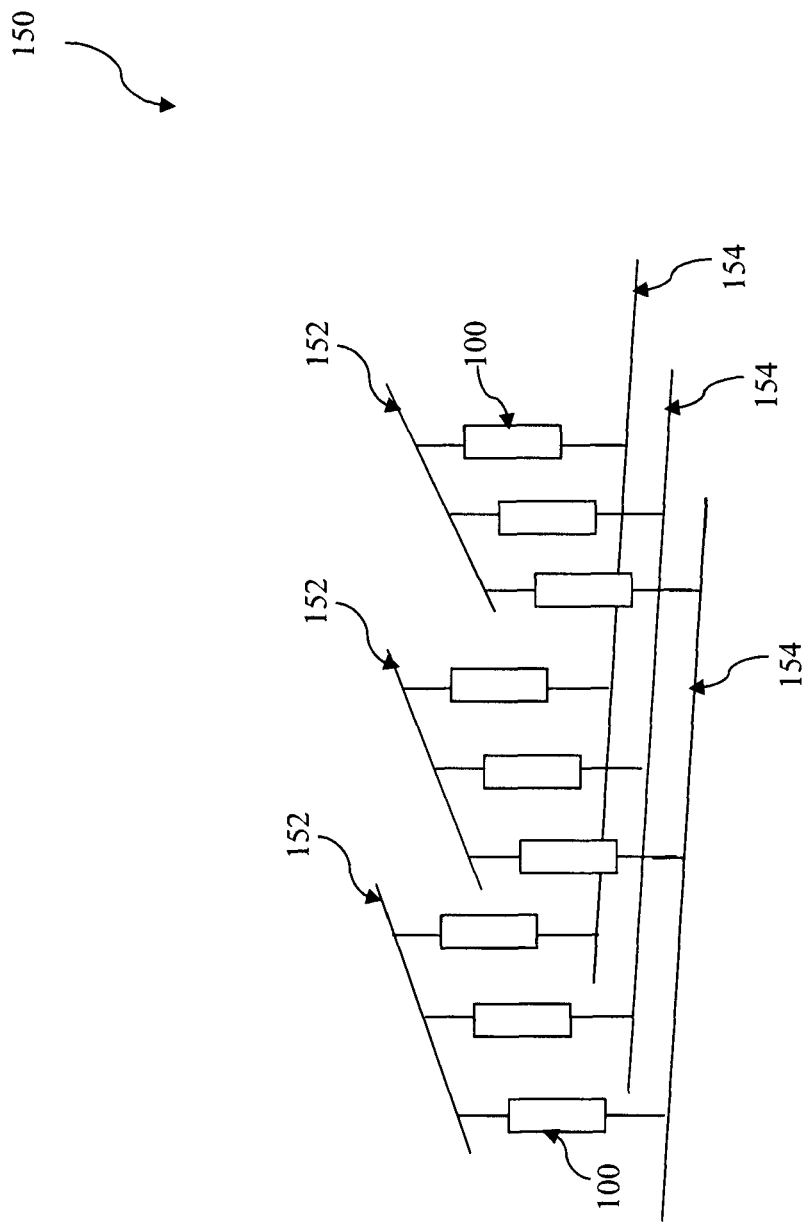
FIG. 9 is a memory structure having a plurality of memory cells constructed according to aspects of the present disclosure in one embodiment.

FIG. 9 illustrates a schematic view of a memory structure 150 having a plurality of memory cells configured in a cross-point architecture in one embodiment. Each memory cell includes a RRAM device 100. As the RRAM device 100 is normally "off" or in the high resistance state, the sneak path issue is eliminated. The cross-point architecture is possible without the sneak path concern. The memory structure 150 includes a plurality of word lines 152 and a plurality of bit lines 154 cross configured. The RRAM devices 100 are configured in the cross-points. Each RRAM device 100 is connected to one of the word lines 152 and one of the bit lines 154. Therefore, the memory structure 150 in the cross-point architecture has a simple structure and has a high packing density. Furthermore, the RRAM device 100 has a simple material stack compared to the conventional CRS device.

The present disclosure provides one embodiment of a resistive random access memory (RRAM) structure. The RRAM structure includes a bottom electrode on a substrate; a resistive material layer on the bottom electrode; and a top electrode on the resistive material layer. The resistive material layer including a defect engineering film.

In one embodiment of the RRAM structure, the resistive material layer includes a dielectric material selected from a metal oxide and a metal oxynitride.

In another embodiment, the RRAM structure includes the resistive material layer includes a transition metal oxide; and the defect engineering film is generated by defect engineering treatment.

In yet another embodiment, the resistive material layer includes zirconium oxide $ZrO_2$ and $ZrO_x$ with a ratio of $ZrO_x/ZrO_2$ being greater than 1. The parameter x is a number less than 2.

In yet another embodiment, the RRAM structure further includes a capping layer disposed between the resistive material layer and the top electrode. In one embodiment, the capping layer and the resistive material layer are a pair of materials selected from the group consisting of titanium and zirconium oxide; tantalum and tantalum oxide; and hafnium and hafnium oxide. In another embodiment, the bottom electrode includes titanium nitride; the resistive material layer includes zirconium oxide; the capping layer includes titanium; and the top electrode includes tantalum nitride.

In yet another embodiment, after a forming process, the transition metal oxide includes a conductive path with a conductive area Ac and a dielectric region with a dielectric area Ad, wherein a ratio between Ac/Ad is greater than about 25%.

The present disclosure also provides another embodiment of a complementary resistive switching random access memory (CRSRAM) device. The CRSRAM device includes a bottom electrode on a substrate; a transition metal oxide layer on the bottom electrode, wherein the transition metal oxide layer includes a defect engineering film; and a top electrode on the transition metal oxide layer.

In one embodiment, the CRSRAM device is configured and designed to have a single resistive state in a first bias voltage less than an intrinsic voltage; and dual resistive states in a second bias voltage range greater than the intrinsic voltage.

In another embodiment, the transition metal oxide layer includes zirconium oxide ZrO2 and ZrOx with a ratio of ZrOx/ZrO2 being greater than 1, wherein x is a number less than 2.

In yet another embodiment, the CRSRAM device further includes a capping layer disposed between the transition metal oxide layer and the top electrode.

In yet another embodiment, the capping layer and the transition metal oxide layer are a pair of materials selected from the group consisting of titanium and zirconium oxide; tantalum and tantalum oxide; hafnium and hafnium oxide.

The present disclosure provides one embodiment of a method of making a resistive random access memory (RRAM) structure. The method includes forming a bottom electrode on a substrate; forming a first dielectric material layer on the bottom electrode; performing a defect engineering treatment (DET) process; and forming a top electrode on the first dielectric material layer.

In one embodiment, the DET process includes applying a NH3 gas to the RRAM structure at a treatment temperature ranging between about 200 C and about 500 C.

In another embodiment, the DET process includes applying a gas selected from the group consisting of NH3, N2, O2, O3, H2O, Cl2, Ar, CF4, H2, N2O, SiH4, CF4, and combinations thereof.

In yet another embodiment, the performing a DET process includes applying the DET process to the bottom electrode before the forming of a first dielectric material layer.

In yet another embodiment, the method further includes forming a capping layer on the first dielectric material layer before the forming a top electrode.

In yet another embodiment, the performing a DET process includes applying the DET process to the first dielectric material layer before the forming a capping layer.

In yet another embodiment, the method further includes forming a second dielectric material layer on the first dielectric material layer after the performing a DET process to the first dielectric material layer.

In yet another embodiment, the forming a first dielectric material layer on the bottom electrode and the forming a capping layer on the first dielectric material layer include forming a transition metal oxide layer and a metal layer selected from the group consisting of zirconium oxide and titanium; tantalum oxide and tantalum; and hafnium oxide and hafnium.

In yet another embodiment, the method further includes performing a post-deposition annealing (PDA) process to the RRAM structure with an annealing temperature ranging between about 300 C and about 500 C.

In yet another embodiment, the forming a first dielectric layer on the bottom electrode includes forming zirconium oxide by atomic layer deposition (ALD).

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making a resistive random access memory (RRAM) structure, comprising:
   forming a bottom electrode on a substrate;
   forming a first dielectric material layer on the bottom electrode;
   selectively performing a defect engineering treatment (DET) process on a first portion of the first dielectric material layer to form a defect engineering film in the first dielectric material layer without performing the DET process on a second portion of the first dielectric material layer, wherein the performing the DET process includes applying $NH_3$ gas to the bottom electrode before the forming of the first dielectric material layer;
   wherein after performing the DET process, the first dielectric material layer includes a first metal oxide within the first portion and a second metal oxide within the second portion,
   wherein after performing the DET process, the first metal oxide has a first oxygen concentration that is less than a second oxygen concentration of the second metal oxide, and
   wherein a ratio of the first metal oxide to the second metal oxide within the first dielectric material layer is greater than 1; and
   forming a capping layer directly on the first dielectric material layer, wherein the forming the capping layer deprives oxygen from the first dielectric material layer using the capping layer; and
   forming a top electrode on the first dielectric material layer; and
   annealing the substrate including the top electrode, first dielectric material layer, the capping layer, and the bottom electrode;
   wherein one or more of the selectively performing the DET treatment, the forming the capping layer, and the performing the anneal generates oxygen vacancies in the first dielectric material layer such that the RRAM structure has a characteristic of a complementary resistive switching (CRS) device.

2. The method of claim 1, wherein the first metal oxide includes $ZrO_x$ and the second metal oxide includes $ZrO_2$, wherein x is a number less than 2.

3. The method of claim 1, wherein the capping layer and the first dielectric material layer are a pair of materials is selected from the group consisting of titanium and zirconium oxide; tantalum and tantalum oxide; and hafnium and hafnium oxide.

4. The method of claim 1, wherein:
the bottom electrode includes titanium nitride;
the capping layer includes titanium; and
the top electrode includes tantalum nitride.

5. The method of claim 1, wherein the DET process includes applying a $NH_3$ gas to the RRAM structure at a treatment temperature ranging from about 200 C to about 500 C.

6. The method of claim 1, wherein the DET process includes applying a gas selected from the group consisting of $NH_3$, $N_2$, $O_2$, $O_3$, $H_2O$, $Cl_2$, Ar, $CF_4$, $H_2$, $N_2O$, $SiH_4$, $CF_4$, and combinations thereof.

7. The method of claim 1, wherein:
the forming the first dielectric material layer on the bottom electrode and the forming the capping layer on the first dielectric material layer include forming a transition metal oxide layer and a metal layer selected from the group consisting of zirconium oxide and titanium; tantalum oxide and tantalum; and hafnium oxide and hafnium.

8. The method of claim 1, wherein the anneal is performed with an annealing temperature ranging from about 300 C to about 500 C.

9. The method of claim 1, wherein the forming the first dielectric material layer on the bottom electrode includes forming zirconium oxide by atomic layer deposition (ALD).

10. A method of making a resistive random access memory (RRAM) structure, comprising:
forming a bottom electrode on a substrate;
forming a first dielectric material layer on the bottom electrode;
selectively performing a defect engineering treatment (DET) process on a first portion of the first dielectric material layer to form a defect engineering film in the first dielectric material layer without performing the DET process on a second portion of the first dielectric material layer,
wherein after performing the DET process, the first dielectric material layer includes a first metal oxide within the first portion and a second metal oxide within the second portion,
wherein after performing the DET process, the first metal oxide has a first oxygen concentration that is less than a second oxygen concentration of the second metal oxide, and
wherein a ratio of the first metal oxide to the second metal oxide within the first dielectric material layer is greater than 1; and wherein the performing the DET process includes applying the DET process to the first dielectric material layer after completing a deposition of the first dielectric material layer and before the forming a capping layer;
forming the capping layer directly on the first dielectric material layer, wherein the forming the capping layer deprives oxygen from the first dielectric material layer using the capping layer; and
forming a top electrode on the first dielectric material layer; and
annealing the substrate including the top electrode, first dielectric material layer, the capping layer, and the bottom electrode;
wherein one or more of the selectively performing the DET treatment, the forming the capping layer, and the performing the anneal generates oxygen vacancies in the first dielectric material layer such that the RRAM structure has a characteristic of a complementary resistive switching (CRS) device.

11. The method of claim 10, wherein the DET process includes applying a $NH_3$ gas to the RRAM structure at a treatment temperature ranging from about 200 C to about 500 C.

12. The method of claim 10, wherein the DET process includes applying a gas selected from the group consisting of $NH_3$, $N_2$, $O_2$, $O_3$, $H_2O$, $Cl_2$, Ar, $CF_4$, $H_2$, $N_2O$, $SiH_4$, $CF_4$, and combinations thereof.

13. The method of claim 10, wherein the performing the DET process includes applying $NH_3$ gas.

14. The method of claim 10, wherein:
the forming the first dielectric material layer on the bottom electrode and the forming the capping layer on the first dielectric material layer include forming a transition metal oxide layer and a metal layer selected from the group consisting of zirconium oxide and titanium; tantalum oxide and tantalum; and hafnium oxide and hafnium.

15. The method of claim 10, wherein the annealing is performed with an annealing temperature ranging from about 300 C to about 500 C.

16. The method of claim 10, wherein the forming the first dielectric material layer on the bottom electrode includes forming zirconium oxide by atomic layer deposition (ALD).

17. The method of claim 10, wherein compositions of the capping layer and the first dielectric material layer respectively are a pair of compositions selected from the group consisting of titanium and zirconium oxide; tantalum and tantalum oxide; and hafnium and hafnium oxide.

* * * * *